(12) United States Patent
Nemanick et al.

(10) Patent No.: US 11,740,298 B2
(45) Date of Patent: Aug. 29, 2023

(54) APPARATUS AND METHOD FOR WIRELESSLY MEASURING BATTERY STATE OF HEALTH

(71) Applicant: The Aerospace Corporation, El Segundo, CA (US)

(72) Inventors: Eric Joseph Nemanick, Santa Monica, CA (US); Robert G. Will, Redondo Beach, CA (US)

(73) Assignee: THE AEROSPACE CORPORATION, El Segundo, CA (US)

( * ) Notice: Subject to any disclaimer, the term of this patent is extended or adjusted under 35 U.S.C. 154(b) by 0 days.

(21) Appl. No.: 17/938,108

(22) Filed: Oct. 5, 2022

(65) Prior Publication Data

US 2023/0026914 A1    Jan. 26, 2023

Related U.S. Application Data

(63) Continuation of application No. 17/186,449, filed on Feb. 26, 2021, now Pat. No. 11,500,030.

(51) Int. Cl.
*G01R 31/00* (2006.01)
*G01R 31/392* (2019.01)
*G01R 31/396* (2019.01)
*G01R 31/371* (2019.01)
*H02J 7/00* (2006.01)

(52) U.S. Cl.
CPC ......... *G01R 31/392* (2019.01); *G01R 31/371* (2019.01); *G01R 31/396* (2019.01); *H02J 7/005* (2020.01)

(58) Field of Classification Search
USPC ......................................... 324/426, 432–435
See application file for complete search history.

(56) References Cited

U.S. PATENT DOCUMENTS

| 4,697,134 | A  | 9/1987 | Burkum et al. |
| 6,832,171 | B2 | 12/2004 | Barsoukov et al. |
| 2011/0077879 | A1 | 3/2011 | Paryani |
| 2022/0077710 | A1 | 3/2022 | Sung |
| 2022/0137140 | A1* | 5/2022 | Yoshimoto ........... G01R 31/371 702/63 |

OTHER PUBLICATIONS

Vincent Q Nguyen, "Non-Final Office Action", dated May 31, 2022, U.S. Appl. No. 17/186,449.
Vincent Q Nguyen, "Notice of Allowance", dated Aug. 3, 2022, U.S. Appl. No. 17/186,449.
Vincent Q Nguyen, "Restriction Requirement", dated Apr. 12, 2022.

* cited by examiner

*Primary Examiner* — Vincent Q Nguyen
(74) *Attorney, Agent, or Firm* — LeonardPatel PC

(57) ABSTRACT

An apparatus for monitoring health of one or more cells in a battery includes a health monitoring system configured to measure voltage on one or more cells when a waveform is injected into the one or more cells. The waveform is measured at an end of a pulse for each current.

14 Claims, 7 Drawing Sheets

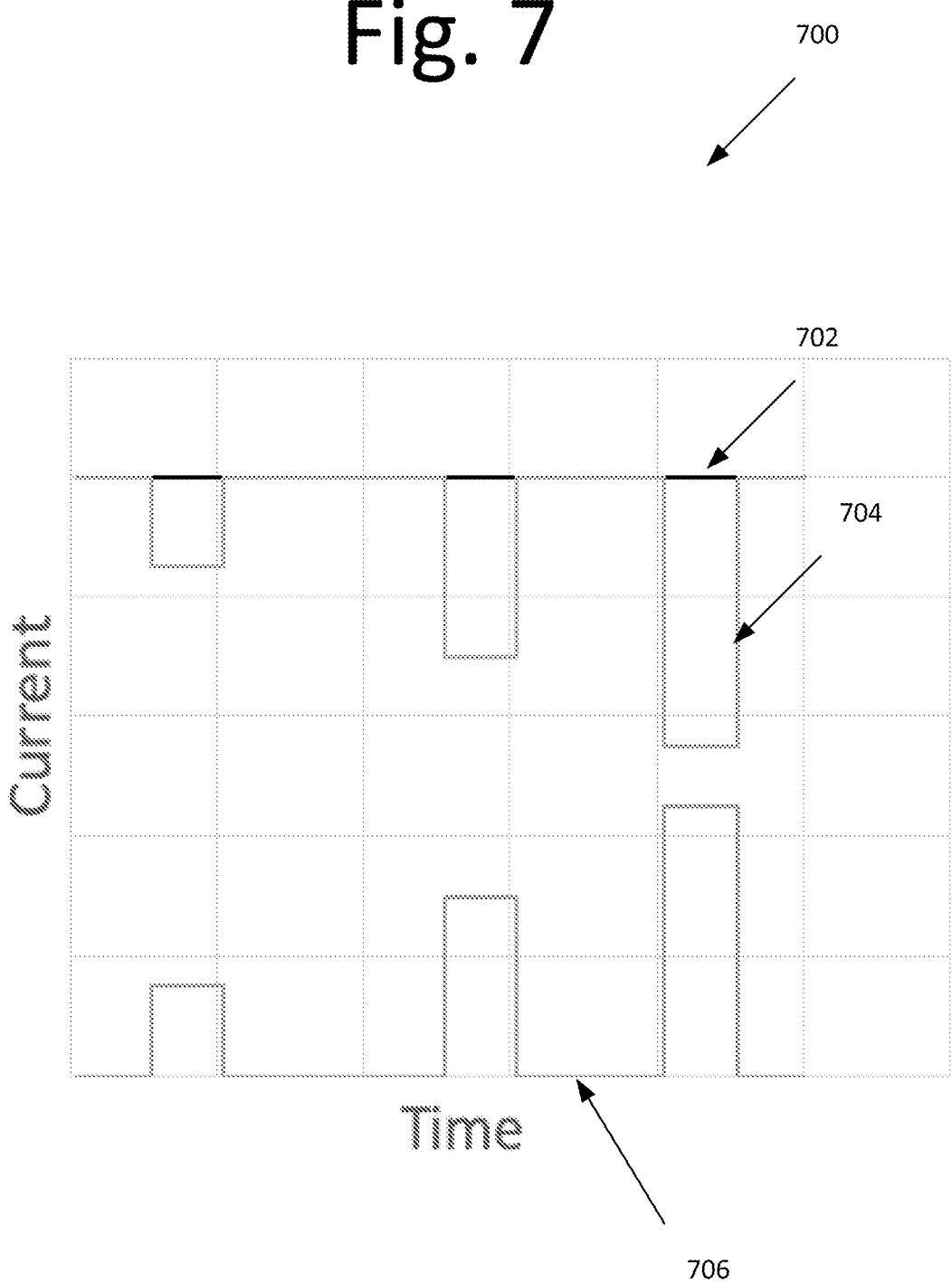

APPARATUS AND METHOD FOR WIRELESSLY MEASURING BATTERY STATE OF HEALTH

CROSS-REFERENCE TO RELATED APPLICATION

This application is a continuation application of, and claims the benefit of, U.S. application Ser. No. 17/186,449, filed on Feb. 26, 2021. The subject matter thereof is hereby incorporated herein by reference in its entirety.

FIELD

The present invention relates to batteries, and more particularly, to wirelessly measuring the state of health of individual battery cells.

BACKGROUND

Typically, impedance measurements are taken when the battery is not in use, and is neither operationally charging nor discharging. This measurement is performed using hardwired electrical lines, typically at the string or full battery level, and not at the individual cell level. This measurement can be performed using direct current (DC) pulses of electricity and measuring the voltage response of the battery. These pulses of current prevent the test from occurring during battery usage as they would disrupt the system the battery is powering. DC Impedance values for a battery, and more importantly, the change in impedance over time and with usage can be used to assess the state of health of the cell or battery, its capability to meet future demand, and be an indicator of future battery failure. Since injecting pulses of current into the battery is required for this measurement, in typical practice the battery must put in an isolated diagnostic or non-interfering mode to prevent damage or alteration to the system the battery is powering. This requirement to isolate the battery prevents state of health measurements in 'always on' power systems such as orbiting spacecraft, and can require expensive non-operational diagnostic times in other systems such as electric vehicles.

The state of health of a battery is strongly dependent on the health of the individual cells that make up the battery. For state of the art accurate impedance and state of health (SoH) measurements of the battery hardwired leads must be connected to each cell within that battery. These extra wires and connections add to the mass of the battery, the required volume of the battery, and to the manufacturing and design complexity of the battery. Hardwired SoH electrical connections to only string, module, or full battery level components will miss changes in the conditions of individual battery cells, which are critical for evaluating the current state of health and forecasting the future state of health of the whole battery.

Accordingly, an improved measurement system to wirelessly and non-disruptively measure the state of health of cells within the battery may be beneficial.

SUMMARY

Certain embodiments of the present invention may provide solutions to the problems and needs in the art that have not yet been fully identified, appreciated, or solved by current battery technologies. For example, some embodiments of the present invention pertain to wirelessly and non-disruptively measuring the state of health of a battery while the battery is in use.

In an embodiment, an apparatus for monitoring health of one or more cells in a battery includes a health monitoring system configured to measure voltage on one or more cells when a waveform is injected into the one or more cells. The waveform is measured at an end of a pulse for each current.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which:

FIG. 7 is a graph illustrating a current scheme of the wSoH operation, according to an embodiment.

DETAILED DESCRIPTION OF THE EMBODIMENTS

Some embodiments generally pertain to measuring the state of health of one or more cells in a battery and the ensemble SoH of all cell(s) being measured. In an embodiment, a wireless state of health measurement device (hereinafter "wSoH device") includes a communication unit containing an antenna and a measurement unit. The wSoH device also includes a control unit between the communication unit and measurement unit. The wSoH device is mounted on the side (or top or underside) of an individual battery cell. In some embodiments, these wSoH devices are installed on each cell to be measured within a battery. In those embodiments, the wSoH devices have short electrical leads, which connect to the positive and negative terminals. Depending on the embodiment, the short electrical leads are implemented at a string level, a pack level, or a module level in larger batteries.

Figure 1:
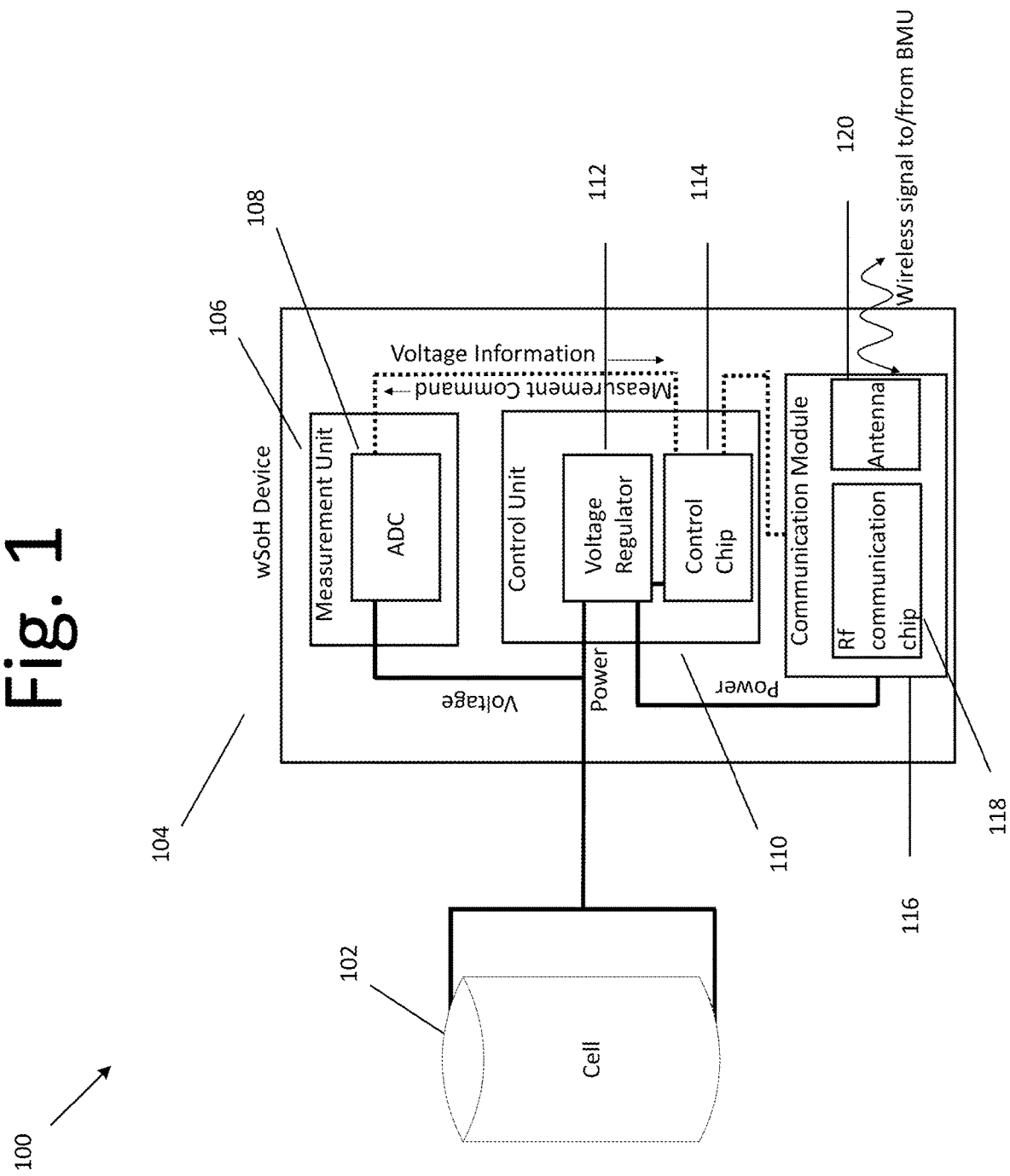
FIG. 1 is a diagram illustrating a wSoH system, according to an embodiment of the present invention.

FIG. 1 is a diagram illustrating a wSoH system 100, according to an embodiment of the present invention. In this embodiment, wSoH system 100 includes a cell 102 connected to a wSoH device 104 through electrical leads. wSoH device 104 includes a measurement unit 106, which includes a voltage measurement circuit in the form of an analog to digital converter (ADC) 108.

ADC 108 may measure the voltage of cell 102, and may output a digital signal to control unit 110 as digital information. In certain embodiments, ADC 108 performs an analog measurement on the voltage received from cell 102 and outputs that measurement as the digital information. This digital information includes voltage information for cell 102 being measured.

Control unit 110 includes voltage regulator 112 and control chip 114. For example, control unit 110 receives information from the battery management unit (BMU) (not shown) through communication module 116 and sends a command to activate measurement unit 106. In an embodiment, control chip 114 receives the information from communication module 116. The received information may include a measurement command requesting voltage information of cell 102. The BMU may request voltage measurements of individual cells at known times that are coordinated with the charging currents the cell is experiencing. These times of voltage measurements are timed to correspond to changes in the charging current so that the BMU has the voltage response to different currents passing through it, which can be evaluated to determine the cell SoH. These commands from the BMU to control unit 110 may include a table of times to perform cell voltage measurements, or in certain embodiments, include a command to measure the voltage as soon as possible. Commands sent by control unit 110 (or control chip 114) then include the command to measure the cell voltage to ADC 108, at times coordinated by control unit 110 as directed by the BMU.

Control unit 110 may also activate measurement unit 106 at times specified by the BMU to take a voltage measurement at times before, during, and after a current change (positive or negative). Control unit 110 may then receive the digital output (voltage information) form measurement unit 106 and then sends that information to communication module 116. In this example, control unit 110 instructs communication module 116 to communicate wirelessly with the BMU by way of antenna 120. In this example, communication module 116 transmits to, and receives information from, the BMU. Data, in some embodiments, may include only single voltage measurements, or voltage-time data pairs, or data packets of voltage and/or voltage-time pairs for any number of voltage measurements.

In this embodiment, a communication module 116 includes a radio frequency (RF) communication chip (or module) 118 and antenna 120. Information sent and received by communication module 116 includes voltage and time information sent from control unit 110, which is received from measurement unit 106, which in this embodiment is ADC 108.

In certain embodiments, voltage regulator 112 powers the wSoH device 104 using power connections from cell 102 to be measured.

It should be appreciated that direct current (DC) impedance measurements can be performed within the battery during an operational mode, i.e., during charging of the battery. The battery is charged with known pulses of current in addition to the normal charging current. Charging, in this example, includes all current(s) cell 102 experiences during the charging period. Also, in this example, the instructions to the charging circuitry from the BMU is altered by introducing current pulses in the charging current, in addition to any pattern of charging current the BMU uses to charge the battery. Other embodiments include measurements during charging patterns that have variations in charging current that allow measurements of the cell(s) at substantially different currents, similar to the introduced pulse mode. The wSoH device may be requested to report the voltage of its cell before, during, and after a current pulse.

In certain embodiments, the wSoH device may be incorporated into existing battery cell technology as an onboard component, where the wSoH device and leads are attached to the cell during the cell manufacturing process. The cells with the wSoH device are then built into a battery with wSoH capability. Otherwise, wSoH capability may be added to a battery design or technology by either adding wSoH devices to the battery cells, or by replacing the cells of a battery with wSoH integrated cells. In either case, the health status of the battery can be monitored.

Figure 2:
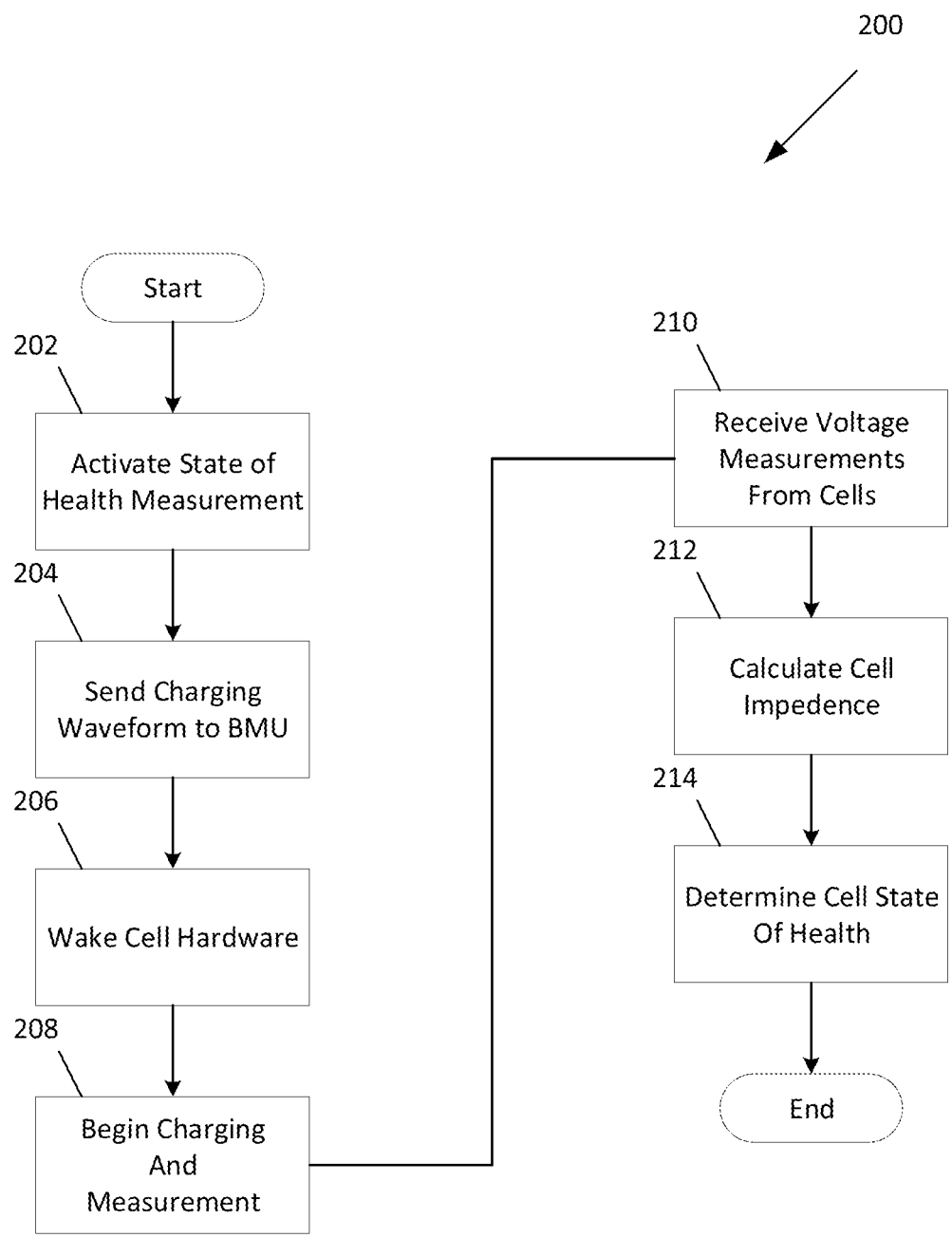
FIG. 2 is a flow diagram illustrating a method for monitoring the state of health of one or more cells in a battery, according to an embodiment of the present invention.

FIG. 2 is a flow diagram illustrating a method 200 for monitoring the state of health of one or more cells in a battery, according to an embodiment of the present invention. In some embodiments, method 200 begins at 202 with activating the status of health measurement during a charging period for the battery. At this point, the BMU has already activated the charging circuits to send a charging current to the battery. After activating the measurement, the BMU alters the charging waveform from the charging circuits to include pulses of current at 204. This request to alter the charging waveform with current pulses allows for the wireless measurements to come either from the BMU software or from the wSoH device. At 206, a wireless signal is sent to any number of wSoH Devices in the battery to wake the wSoH device(s). This signal includes the time indices at which the wSoH Device(s) is to being charging and to perform measurement of the voltage of its cell at 208. The wSoH device(s) then transmits the measured voltage, time pairs back to the BMU in step 210. At 212, the individual cell impedances are calculated using Ohm's Law, and at 214, the battery state of health is determined from changes in the cell impedances.

Figure 3:
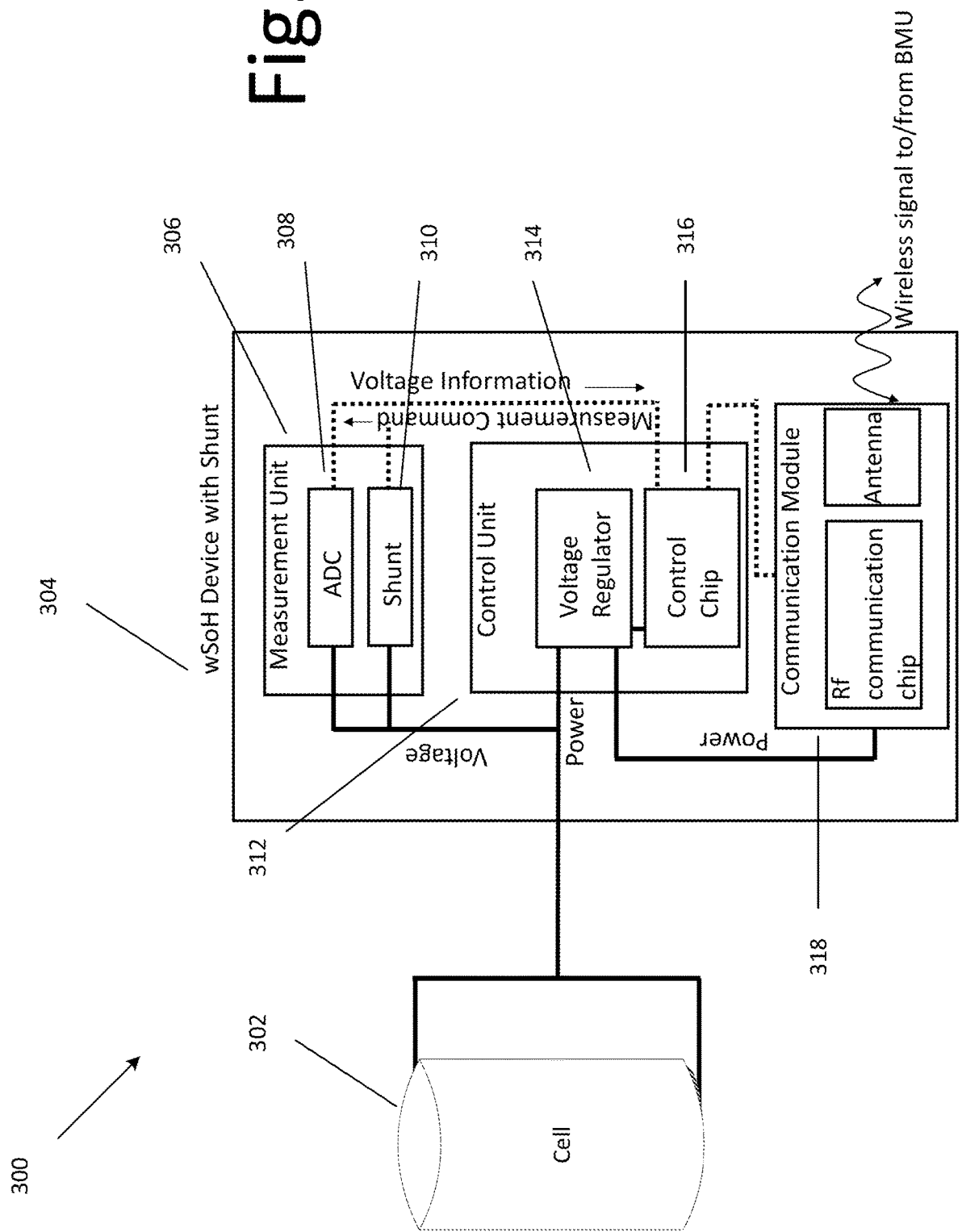
FIG. 3 is a diagram illustrating a battery management system, according to an embodiment of the present invention.

FIG. 3 is a diagram illustrating a battery management system 300, according to an embodiment of the present invention. Similar to FIG. 1, battery management system 300 includes cell 302 connected to wSoH device 304 with activatable resistive shunt(s). WSoH device 304 includes a measurement unit 306 containing ADC 308 and shunt 310, a control unit containing a voltage regulator 314 and control chip 316, and a communication module 318 configured to transmit wireless commands to, and receive wireless commands from, the BMU.

In this embodiment, battery management system 300 is used where the BMU cannot alter the charging current and requires wSoH device 304 to create negative current pulses by bypassing some part of the current during the charging process. wSoH device 304 has separate electrical leads connecting to the positive and negative terminals of cell 302. These leads are connected separately to ADC 308 and shunt 310 of measurement unit 306.

In certain embodiments ADC 308 performs measurements of one or more cells (e.g., cell 102) while resistive shunt 310 bypasses a known portion of the current flowing through cell 302. This activation of a partial current bypass through a resistive shunt (e.g., shunt 310) causes cell 302 to experience a current flow that is less than the baseline current flowing through cell 302 during the charging process. Voltage measurements with resistive shunt 310 in parallel to cell 302 and voltage measurements with resistive shunt 310 not active allows for measurement of cell 302 DC impedance using Ohm's Law. The voltage measurements of cell 302 at two different currents gives sufficient information to determine SoH of cell 302, and allow for tracking of changes to cell 302 during usage, and over life, giving a profile of the cell's performance.

Figure 4:
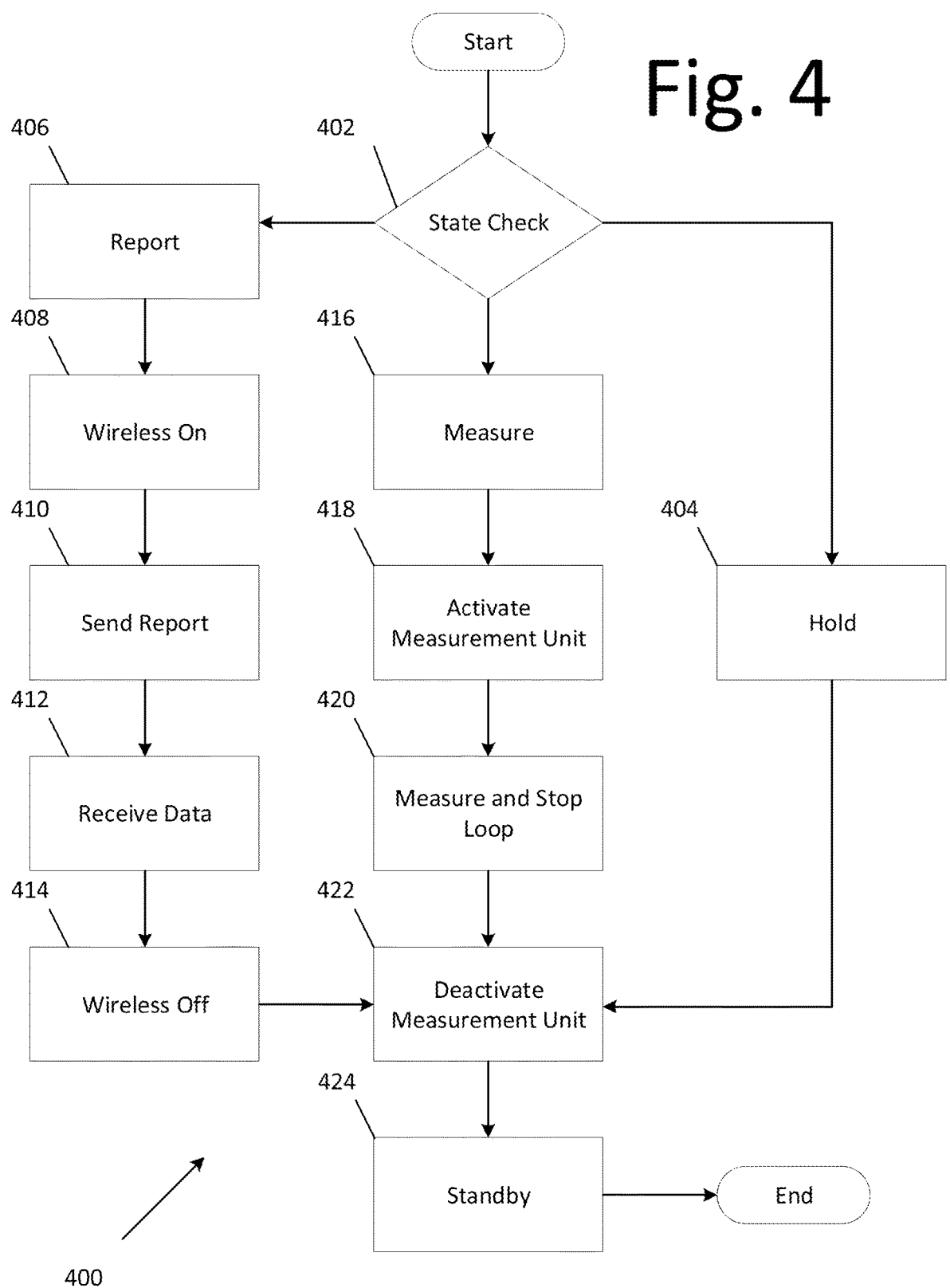
FIG. 4 is a flow diagram illustrating a method for measuring the state of health for the one or more cells, according to an embodiment of the present invention.

FIG. 4 is a flow diagram illustrating a method 400 for measuring the state of health for the one or more cells, according to an embodiment of the present invention.

To summarize, the hardware checks the command state from the battery management unit. In a report state, the hardware activates and sends its data to the battery management unit. In the measure state, the hardware activates, measures the voltage for the one or more cells, and stores for later transmission. After measuring this value, the hardware sets it next state to 'report.' In the hold state, the hardware does not activate and waits for a command to change its state.

A more detailed description is as follows. The hardware in the wSoH device is woken from a low power sleep mode. In this mode, the wSoH device draws little power to avoid draining the battery when the wSoH device is not in use. At 402, the hardware checks the command state from the battery management unit. The command state may be one of report state, measurement state, or hold state. If the command state is in a hold state, method 400 moves to the hold state at 402.

If, however, the command state is a report state, method 400 moves to the report state at 406. At 408, the hardware activates the wireless transmitter, and at 410, sends the voltage measurement of the cell to the BMU. As soon as the battery management unit receives the report at 412, the hardware deactivates the wireless transmitter at 414 to preserve power.

If the command state is a measurement state, the hardware enters into a measurement state at 416. At 418, the hardware activates (or turns on) the measurement unit.

At 420, the hardware measures the voltage on the cell at the times specified by the BMU, and stores the measurements in a database local to the hardware. See, for example, FIG. 5, line 502.

At 422, the hardware deactivates the measurement unit and evaluates the status (i.e., the measurement state). In this step, a new state (e.g., report state or hold state) is set, and at 424, method 400 enters the standby state. This method may be repeated each time the hardware is turned on.

In an alternative embodiment, the method may measure the state of health of a wSoH equipped battery, according to an embodiment of the present invention. The wSoH equipped battery may be used in an application where the BMU cannot alter the charging current and requires the embodiment of the device that contains the current shunt capability to create negative pulses. Similar to FIG. 2, the method may begin with powering on the hardware after receiving a wake up signal from the BMU, and performing a state check. This state is set by the wakeup signal from the BMU. As in the above embodiment, in the hold state the hardware waits for the next signal from the BMU, and in the Report state the hardware transmits the stored cell voltage data. In the Measure state, at step 418, the measurement unit includes a resistive shunt, and the measurement unit may now be activated with or without activating the resistive shunt component of the measurement unit. Without activating the shunt, the measurement of the voltage is of the cell under the baseline current. When activated, the shunt bypasses a portion of the charging current to the cell, enabling a voltage measurement at a different current than the baseline charging current. These voltage measurements at different current values enable calculating the state of health of the cell using Ohm's Law.

Figure 5:
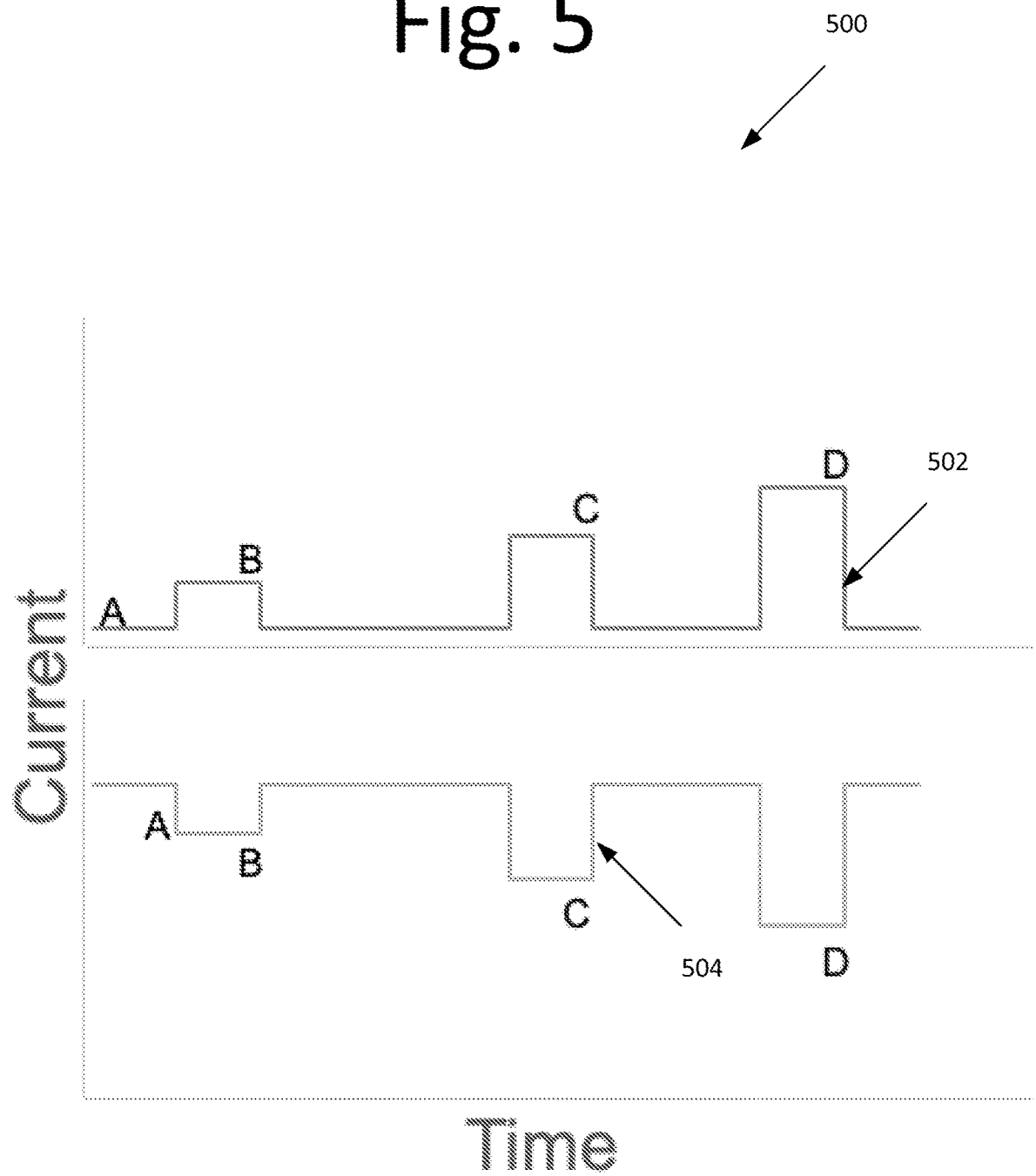
FIG. 5 is a graph illustrating two modes for SoH measurement, where the BMU can alter charge waveform, according to an embodiment of the present invention.

FIG. 5 is a graph 500 illustrating the charging current to the cell during measurements of the cell state of health, according to an embodiment of the present invention. In 502, the baseline current value, A, is the normal charging current of the cell. This value A can be a static value or a current pattern that is time, state of charge, or temperature variant. Current changes to values B, C, or D, represents changes to the current passing through the cell as directed by the BMU to its charging circuitry.

To measure the instantaneous state of health of the cell, the voltage is measured at B (or C, or D, or any number of selected current to improve the measurement), and the measured voltage has the voltage at A subtracted from it to obtain the change in Voltage between A and B. This value is then divided by the change in current between the two steps to derive the cell impedance. The change in the cell impedance for these measurements over time or with usage is the cell stage of health.

In 504, the measurement process is identical, except that the changes in current B, C, and D, are negative of the baseline current A, though not necessarily negative with respect to reversing the current flow through the cell. Use of these 'negative' current changes can be used either in the embodiments with the resistive shunt activated in parallel to the cell, or in cases at high cell state of charge, where increases in the charging current would risk an overcharge or overvoltage condition in the cell.

Figure 6:
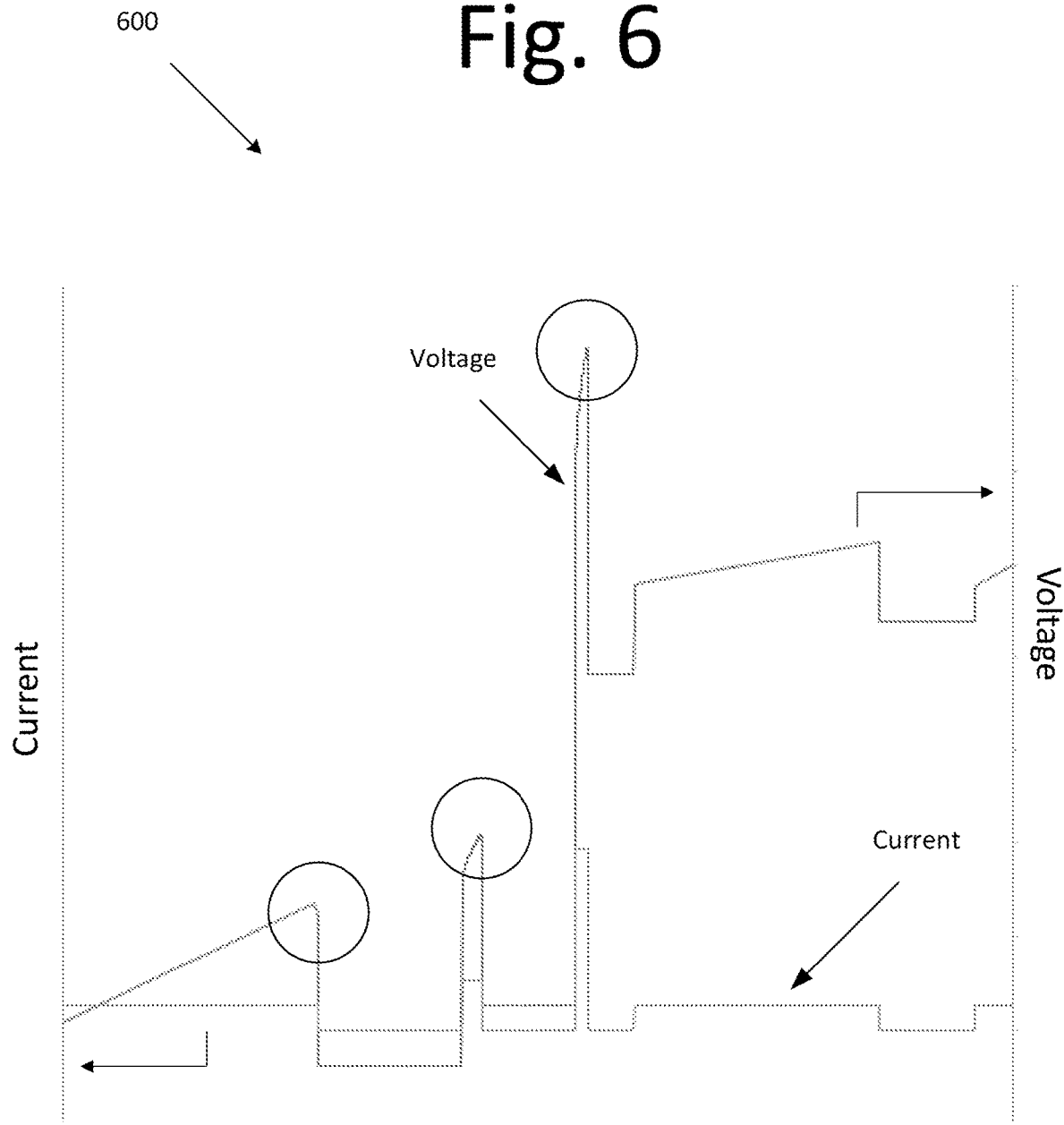
FIG. 6 is a graph illustrating an example of the current injection pulses for the measurement and an example voltage response to the current, according to an embodiment of the present invention.

FIG. 6 is a graph 600 illustrating an example of the current injection pulses for the measurement and an example voltage response to the current, according to an embodiment of the present invention. The circles in FIG. 6 indicate the times where the wSoH Device reports the voltage of the cell. The voltage and current data at these times are used to calculate the cell impedance using Ohm's law. This measurement can be performed at any state of charge for the cell while the battery is in use without disrupting operation.

For states of charge where the introduction of high current pulses to the cell would risk the cell going into an overvoltage condition, e.g., close to 100% state of charge, the measurement can also be made using negative pulses of current. This 'negative pulse' is a deficit to the ongoing charging current, and does not represent reversal of current in charging, only less current than the baseline charging current. The state of health of the whole battery is determined by evaluating the change in impedance of the battery cells as a whole, as well as from the largest deviations in performance of the worst cell(s).

The wSoH measurement in the preceding example requires the capability for the battery management unit to alter the charging current from the charging circuitry to include pulses of current. For utilization in systems that do not have BMU's capable of altering the charging current to include pulses of current to measure the state of health of the battery using this technology, a modified embodiment of the wSoH Device can be employed. This capability can also be incorporated in otherwise charge current alteration capable systems where SoH measurement at close to maximum cell voltage is desired. See, for example, FIG. 3, which shows a current shunt in parallel to the analog to digital voltage measurement circuit. This current shunt is activated by the control unit of the wSoH device. When activated, the shunt takes a portion of the current passing through the cell during charging and bypasses the current around the cell. This acts to expose the cell to a lower current, or a negative pulse, compared to the baseline charging current.

FIG. 7 is a graph 700 illustrating a current scheme of the wSoH operation, according to an embodiment. 702 shows an example of a constant charging current generated externally to the wSoH device by the charging circuits and controlled by the BMU, though the charging current can have any shape. 706 shows the amount of current being bypassed for an individual cell/wSoH device. This cell then experiences the current in 704, with negative current pulses when the current shunt function is activated. By activating the voltage measurement in the same fashion as in FIG. 6, but before, during, and after the negative current pulse, the impedance of an individual cell can be measured.

It will be readily understood that the components of various embodiments of the present invention, as generally described and illustrated in the figures herein, may be arranged and designed in a wide variety of different configurations. Thus, the detailed description of the embodiments of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A method for performing a wireless state of health (wSOH) on one or more cells in a battery, the method comprising:
   receiving an activation signal from a battery management unit, wherein the activation signal switches a wSoH device from a HOLD state to a MEASURE state causing the wSoH device to perform voltage measurement on the one or more cells in the battery;
   measuring internal cell resistance by measuring a change in voltage of the one or more cells at a time specified by the activating signal while a portion of a charging current is bypassed by a shunt,
   storing the measured voltage as digital information; and
   switching the wSoH device from the MEASURE state to a HOLD state, forcing the wSoH device to enter in a standby state or sleep state.

2. The method of claim 1, wherein the activating of the wSoH device comprises acquiring power by a voltage regulator in order to power the wSoH device.

3. The method of claim 1, wherein the activating of the wSoH device further comprises
   determining a state for the wSoH based on the activating signal received from the battery management unit, and
   changing the state from the HOLD state to the MEASURE state or a REPORT state.

4. The method of claim 3, wherein, when the wSOH device is in the REPORT state, wirelessly transmitting the digital information to the battery management unit via a communication unit.

5. The method of claim 3, wherein, when the wSOH device is in the MEASURE state, beginning the measuring process of the one or more cells.

6. The method of claim 1, further comprising:
   deactivating the wSoH device, wherein the deactivating the sWoH device comprises
   waiting for a command from the battery management unit before changing change from the HOLD state to the MEASURE state or the REPORT state.

7. The method of claim 1, wherein the measuring of the voltage on the one or more cells comprises
   subtracting a baseline voltage from the voltage being measured to calculate a change in voltage value, and
   dividing the change in voltage value by a change in current.

8. The method of claim 7, wherein the baseline voltage being a static value or a current pattern that is time, state of charge, or temperature variant.

9. A method for performing a wireless state of health (wSOH) on one or more cells in a battery, the method comprising:
   receiving, by a wSOH device, an activation signal from a battery management unit;
   switching, using the activation signal, the wSoH device from a HOLD state to a MEASURE state causing the wSoH device to perform voltage measurement on the one or more cells in the battery, wherein the switching the wSoH from the HOLD state to the MEASURE state comprises acquiring power by a voltage regulator to power the wSoH device;
   measuring an internal cell resistance, wherein the measuring of the internal cell resistance comprises measuring a change in voltage of the one or more cells at a time specified by the activating signal,
   storing the measured voltage as digital information; and
   switching the wSoH device from the MEASURE state to a HOLD state, forcing the wSoH device to enter in a standby state or sleep state.

10. The method of claim 9, wherein the activating of the wSoH device further comprises
    determining a state for the wSoH based on the activating signal received from the battery management unit, and
    changing the state from the HOLD state to the MEASURE state or a REPORT state.

11. The method of claim 10, wherein, when the wSOH device is in the REPORT state, wirelessly transmitting the digital information to the battery management unit via a communication unit.

12. The method of claim 10, wherein, when the wSOH device is in the MEASURE state, beginning the measuring process of the one or more cells.

13. The method of claim 9, further comprising:
    deactivating the wSoH device, wherein the deactivating the sWoH device comprises
    waiting for a command from the battery management unit before changing change from the HOLD state to the MEASURE state or the REPORT state.

14. The method of claim 9, wherein the measuring of the voltage on the one or more cells comprises
    subtracting a baseline voltage from the voltage being measured to calculate a change in voltage value, the baseline voltage is a static value or a current pattern that is time, state of charge, or temperature variant, and
    dividing the change in voltage value by a change in current.

\* \* \* \* \*